US011923365B2

(12) United States Patent
Yim et al.

(10) Patent No.: US 11,923,365 B2
(45) Date of Patent: Mar. 5, 2024

(54) INTEGRATED CIRCUIT DEVICES INCLUDING TRANSISTOR STACKS HAVING DIFFERENT THRESHOLD VOLTAGES AND METHODS OF FORMING THE SAME

(71) Applicant: Samsung Electronics Co., Ltd., Suwon-si (KR)

(72) Inventors: Jeonghyuk Yim, Halfmoon, NY (US); Ki-Il Kim, Clifton Park, NY (US); Gil Hwan Son, Clifton Park, NY (US); Kang Ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 265 days.

(21) Appl. No.: 17/387,178

(22) Filed: Jul. 28, 2021

(65) Prior Publication Data

US 2022/0375935 A1 Nov. 24, 2022

Related U.S. Application Data

(60) Provisional application No. 63/190,857, filed on May 20, 2021.

(51) Int. Cl.
*H01L 27/092* (2006.01)
*H01L 21/8238* (2006.01)
(Continued)

(52) U.S. Cl.
CPC .... *H01L 27/0922* (2013.01); *H01L 21/82385* (2013.01); *H01L 21/823857* (2013.01);
(Continued)

(58) Field of Classification Search
CPC ........... H01L 27/0922; H01L 21/82385; H01L 21/823857; H01L 21/823871; H01L 29/0665; H01L 29/401; H01L 29/42368; H01L 29/42376; H01L 29/42392; H01L 29/66742; H01L 29/78645; H01L 29/78696; H01L 21/8221; H01L 21/82345; H01L 21/823462; H01L 21/823842; H01L 29/66439; H01L 27/088; H01L 29/0673; H01L 29/775; H01L 27/0688;
(Continued)

(56) References Cited

U.S. PATENT DOCUMENTS 10,020,202 B2 7/2018 Kang et al.
10,770,353 B2 9/2020 Wang
(Continued)

FOREIGN PATENT DOCUMENTS

EP 4016603 A1 6/2022

OTHER PUBLICATIONS

Extended European Search Report corresponding to EP 22164416.4 dated Sep. 15, 2022 (9 pages).

*Primary Examiner* — David Vu
(74) *Attorney, Agent, or Firm* — Myers Bigel, P.A.

(57) ABSTRACT

Integrated circuit devices may include two transistor stacks including lower transistors having different threshold voltages and upper transistors having different threshold voltages. Gate insulators of the lower transistors may have different dipole elements or different areal densities of dipole elements, and the upper transistors may have different gate electrode structures.

11 Claims, 15 Drawing Sheets

3000

23U_1 25U_1 54 54 21U 46 22U 22U 22U UT1 23L 21L_1 22L 22L 22L LT1 25L 42 100U 100 100L CFET1

23U_2 25U_2 54 54 21U 46 22U 22U 22U UT2 23L 21L_2 22L 22L 22L LT2 25L 42 100 CFET2

23U_3 25U_3 54 54 21U 46 22U 22U 22U UT3 23L 21L_3 22L 22L 22L LT3 25L 42 100 CFET3

(51) Int. Cl.
*H01L 29/06* (2006.01)
*H01L 29/40* (2006.01)
*H01L 29/423* (2006.01)
*H01L 29/66* (2006.01)
*H01L 29/786* (2006.01)

(52) U.S. Cl.
CPC .. *H01L 21/823871* (2013.01); *H01L 29/0665* (2013.01); *H01L 29/401* (2013.01); *H01L 29/42368* (2013.01); *H01L 29/42376* (2013.01); *H01L 29/42392* (2013.01); *H01L 29/66742* (2013.01); *H01L 29/78645* (2013.01)

(58) Field of Classification Search
CPC ............. H01L 27/092; H01L 29/42364; H01L 29/42372; H01L 29/495; H01L 29/4966; B82Y 10/00
See application file for complete search history.

(56) References Cited

U.S. PATENT DOCUMENTS 10,825,736 B1 * 11/2020 Zhang .................. H01L 29/775
2020/0020595 A1 1/2020 Bao et al.
2020/0294969 A1 9/2020 Rachmady et al.
2021/0013111 A1 1/2021 Smith et al.
2021/0066137 A1 3/2021 Hsu et al.
2021/0082766 A1 3/2021 Miura et al.
2021/0098294 A1 4/2021 Smith et al.

* cited by examiner

| | n-type LT1 (21L_1) | n-type LT2 (21L_2) | n-type LT3 (21L_3) |
|---|---|---|---|
| Threshold voltage | Vth_1 | Vth_2 | Vth_3 |
| | Vth_1 < Vth_2 < Vth_3 | | |
| Scenario 1 | N-dipole | - | P-dipole |
| Scenario 2 | High areal density N-dipole | N-dipole | - |
| Scenario 3 | - | P-dipole | High areal density P-dipole |

FIG. 2A

| | p-type LT1 (21L_1) | p-type LT2 (21L_2) | p-type LT3 (21L_3) |
|---|---|---|---|
| Threshold voltage | Vth_1 | Vth_2 | Vth_3 |
| | \|Vth_1\| < \|Vth_2\| < \|Vth_3\| | | |
| Scenario 4 | P-dipole | - | N-dipole |
| Scenario 5 | High areal density P-dipole | P-dipole | - |
| Scenario 6 | - | N-dipole | High areal density N-dipole |

FIG. 2B

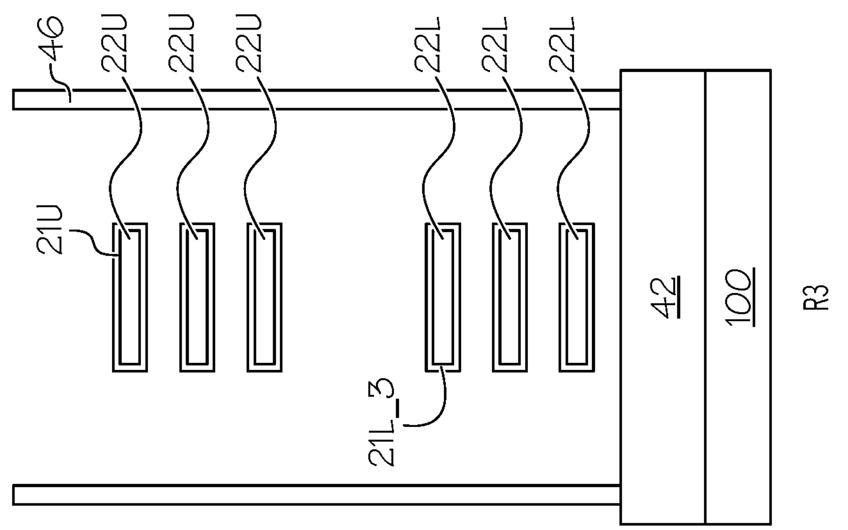
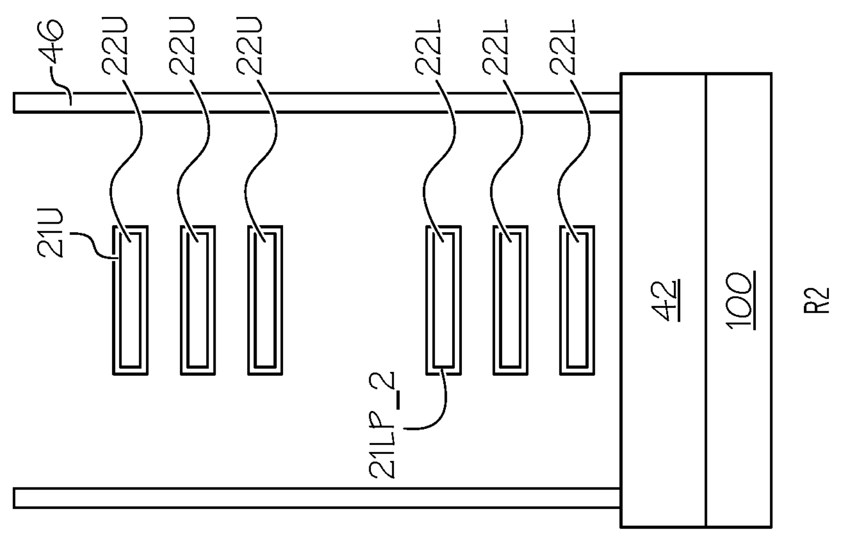
FIG. 5
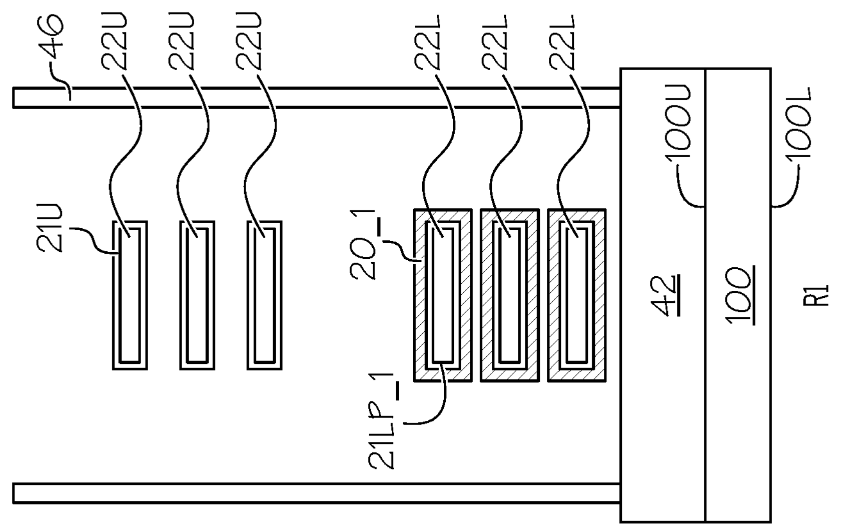

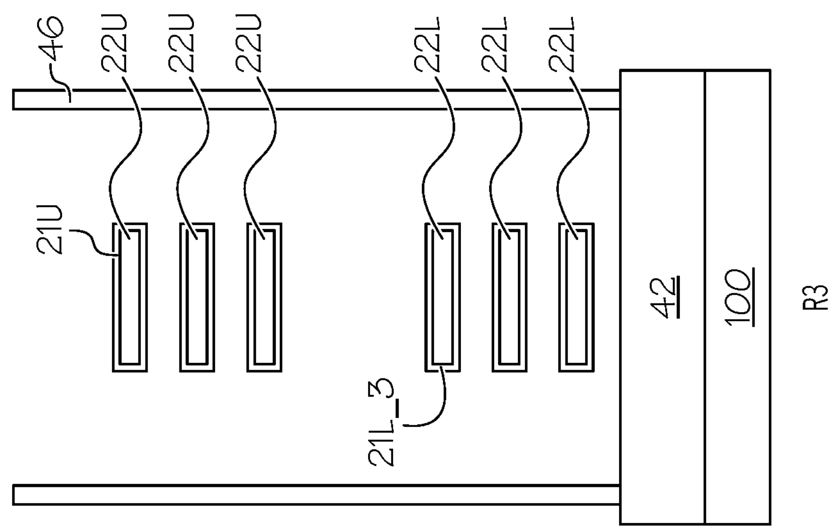
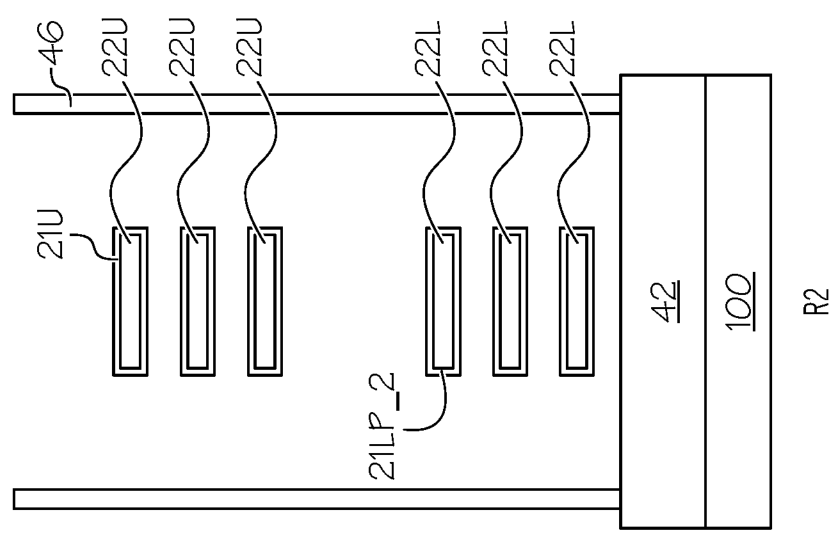
FIG. 6
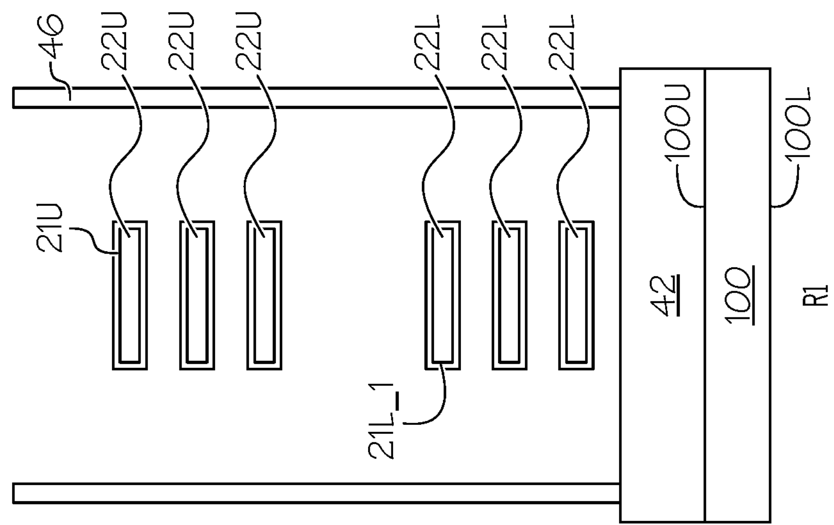

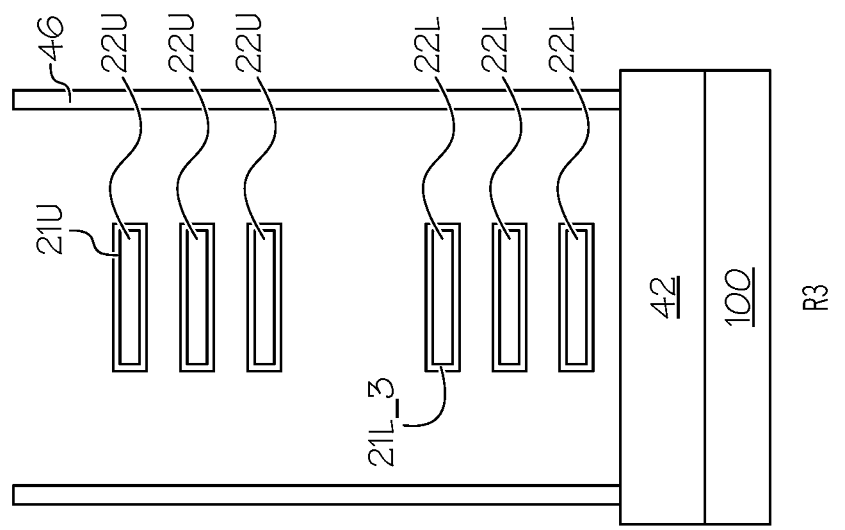
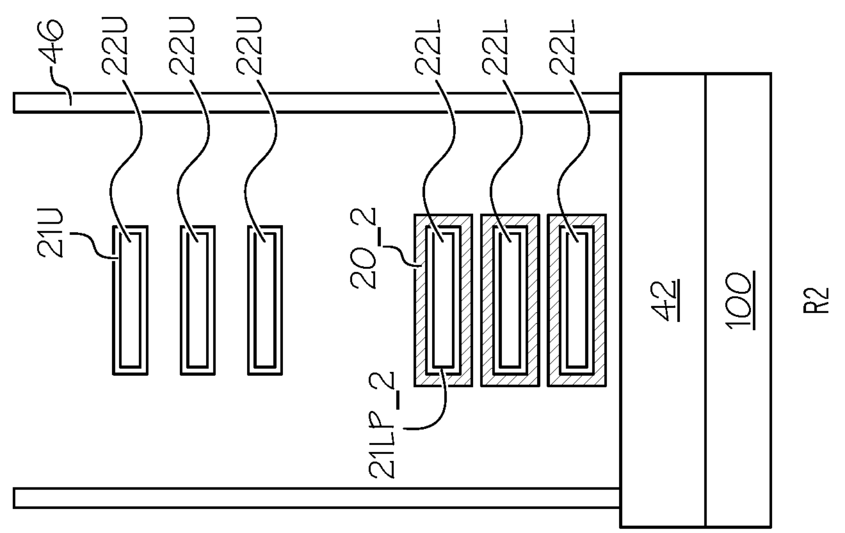
FIG. 7
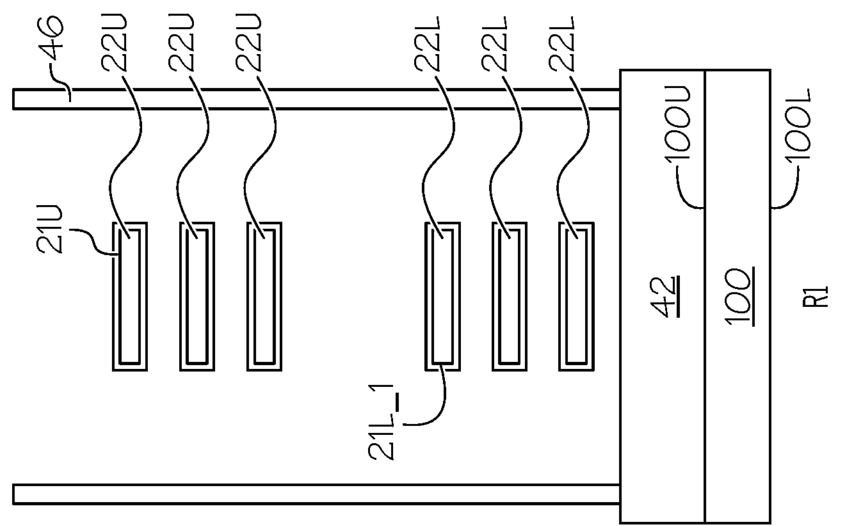

R1
R2
R3
72_1
72_2
72_3
11A
62
11B
64
11C
25U_1
23U_1
11D
66
25U_2
23U_2
11E
68
25U_3
23U_3
11F

INTEGRATED CIRCUIT DEVICES INCLUDING TRANSISTOR STACKS HAVING DIFFERENT THRESHOLD VOLTAGES AND METHODS OF FORMING THE SAME

CROSS-REFERENCE TO RELATED APPLICATION

This application claims priority to U.S. Provisional Application Ser. No. 63/190,857, entitled 3D STACKED DEVICE INCLUDING TRANSISTORS HAVING DIFFERENT THRESHOLD VOLTAGES, filed in the USPTO on May 20, 2021, the disclosure of which is hereby incorporated by reference herein in its entirety.

FIELD

The present disclosure generally relates to the field of electronics and, more particularly, to integrated circuit devices including stacked transistors.

BACKGROUND

An integrated circuit device including stacked transistors, such as a complementary field effect transistor (CFET) stack, was introduced to reduce its area to close to one-half of the area of a corresponding non-stacked device. Though it is beneficial to include multiple stacked transistors having different threshold voltages in a device to reduce leakage power, it may be difficult to form lower transistors having different threshold voltages using conventional methods as upper transistors overlap the lower transistors.

SUMMARY

According to some embodiments of the present inventive concept, integrated circuit devices may include a first CFET stack and a second CFET stack on a substrate. The first CFET stack may include a first upper transistor including a first upper active region and a first upper gate work function layer having a first thickness on the first upper active region and including a first lower transistor including a first lower active region, a first lower gate insulator including first dipole elements at a first areal density, and a first lower gate work function layer on the first lower gate insulator. The second CFET stack may include a second upper transistor including a second upper active region and a second upper gate work function layer having a second thickness on the second upper active region and a second lower transistor including a second lower active region, a second lower gate insulator comprising second dipole elements at a second areal density, and a second lower gate work function layer on the second lower gate insulator. The first dipole elements and the second dipole elements may have different conductivity types, or the first areal density may be different from the second areal density when the first dipole elements and the second dipole elements have the same conductivity type. The first thickness may be different from the second thickness.

According to some embodiments of the present inventive concept, methods of forming an integrated circuit device may include forming a first preliminary CFET stack and a second preliminary CFET stack in an insulating layer on a substrate. The first preliminary CFET stack may be in a first opening of the insulating layer and may include a first upper active region, a first upper gate insulator, a first lower active region, a first lower gate insulator that includes first dipole elements. The second preliminary CFET stack may be in a second opening of the insulating layer and may include a second upper active region, a second upper gate insulator, a second lower active region, and a second lower gate insulator that includes second dipole elements. The methods may also include forming a preliminary lower gate work function layer on the first and second preliminary CFET stacks, forming a preliminary lower gate metal layer on the preliminary lower gate work function layer, forming a first lower gate work function layer and a first lower gate metal layer on the first lower gate insulator and forming a second lower gate work function layer and a second lower gate metal layer on the second lower gate insulator by removing the preliminary lower gate work function layer and the preliminary lower gate metal layer from upper portions of the first and second openings, and forming a first upper gate work function layer and a first upper gate metal layer on the first upper gate insulator in the upper portion of the first opening and forming a second upper gate work function layer and a second upper gate metal layer on the second lower gate insulator in the upper portion of the second opening.

BRIEF DESCRIPTION OF THE DRAWINGS

FIGS. 2A and 2B are tables for conductivity types and areal densities of dipole elements of gate insulators according to some embodiments of the present inventive concept.

FIGS. 5-11 are cross-sectional views illustrating methods of forming an integrated circuit device according to some embodiments of the present invention.

DETAILED DESCRIPTION

Methods of forming an integrated circuit device including CFET stacks may include forming lower gate electrodes of lower transistors in lower portions of deep openings (i.e., openings having high aspect ratios). Accordingly, it may be difficult to form the lower transistors having different threshold voltages by forming different lower gate work function layers, as forming those lower gate work function layers may require multiple patterning processes. According to some embodiments of the present invention, lower transistors having different threshold voltages may be formed by forming gate insulators having different dipole elements or different dipole areal densities, and lower gate work function layers of the lower transistors can have the same thickness and can include the same material(s). Therefore, lower transistors having different threshold voltages may be formed without multiple patterning processes. Further, the lower transistors may have a uniform height, as the lower gate work function layers that have the same thicknesses and include the same material(s) are removed to form the lower transistors.

According to some embodiments of the present invention, upper transistors having different threshold voltages may be formed by forming upper gate work function layers having different thicknesses and/or different materials. Therefore, annealing processes for dipole element diffusion, which are performed at high temperatures, may be omitted and lower transistors already formed may not be damaged during those high temperature processes.

Figure 1:
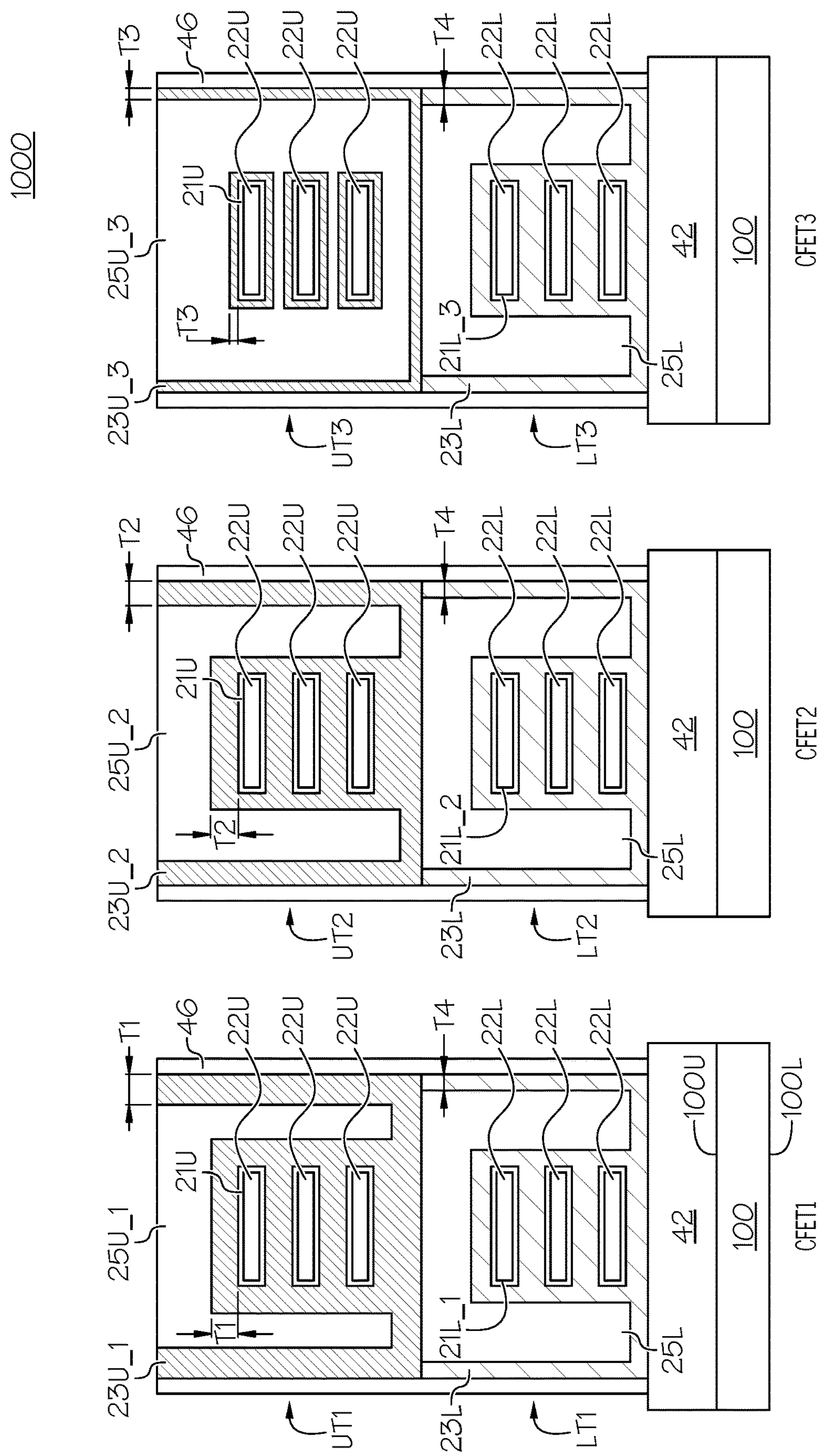
FIG. 1 shows cross-sectional views of CFET stacks of an integrated circuit device according to some embodiments of the present invention.

FIG. 1 shows cross-sectional views of CFET stacks of an integrated circuit device 1000 according to some embodiments of the present invention. The cross-sectional views are taken along a channel width direction of transistors of CFET stacks. The integrated circuit device 1000 may be a monolithic CFET device in which stacked transistors are formed on a single substrate (e.g., a substrate 100). Referring to FIG. 1, the integrated circuit device 1000 may include a first CFET stack CFET1, a second CFET stack CFET2, and a third CFET stack CFET3 on a substrate 100. In some embodiments, a first insulating layer 42 may be optionally provided between the substrate 100 and the first, second and third CFET stacks CFET1, CFET2, CFET3 to reduce a substrate leakage current. In some embodiments, the first insulating layer 42 may be omitted, and the first, second and third CFET stacks CFET1, CFET2, CFET3 may be provided directly on the substrate 100. For example, the first insulating layer 42 may include silicon oxide and/or a material having a dielectric constant lower than silicon oxide or silicon nitride. Each of the first, second and third CFET stacks CFET1, CFET2, CFET3 may be provided in a second insulating layer 46 that is provided on the substrate 100. The substrate 100 may include an upper surface 100U facing the first, second and third CFET stacks CFET1, CFET2, CFET3 and a lower surface 100L opposite the upper surface 100U. For example, the second insulating layer 46 may include silicon nitride, silicon oxide and/or or a material that has a dielectric constant lower than that of silicon oxide or silicon nitride. In some embodiments, the second insulating layer 46 may be a silicon nitride layer. The first and second insulating layers 42 and 46 may include the same material or different materials. The second insulating layer 46 may be used as a mold during a manufacturing process and may be also referred to as a spacer.

The first CFET stack CFET1 may include a first lower transistor LT1 and a first upper transistor UT1 that are stacked in a vertical direction that is perpendicular to the upper surface 100U of the substrate 100. The first lower transistor LT1 may include a first lower active region 22L, a first lower gate insulator 21L_1, a first lower gate work function layer 23L, and a first lower gate metal layer 25L.

The second CFET stack CFET2 may include a second lower transistor LT2 and a second upper transistor UT2 that are stacked in the vertical direction. The second lower transistor LT2 may include a second lower active region 22L, a second lower gate insulator 21L_2, a second lower gate work function layer 23L, and a second lower gate metal layer 25L.

The third CFET stack CFET3 may include a third lower transistor LT3 and a third upper transistor UT3 that are stacked in the vertical direction. The third lower transistor LT3 may include a third lower active region 22L, a third lower gate insulator 21L_3, a third lower gate work function layer 23L, and a third lower gate metal layer 25L. The first, second and third upper transistors UT1, UT2, UT3 may overlap the first, second and third lower transistors LT1, LT2, LT3, respectively.

Elements of the first lower transistor LT1, the second lower transistor LT2, and the third lower transistor LT3 may have identical dimensions in the vertical direction and a horizontal direction that is parallel to the upper surface 100U of the substrate 100. Primary differences between the first lower transistor LT1, the second lower transistor LT2, and the third lower transistor LT3 may be areal densities and/or conductivity types of dipole elements included in the first lower gate insulator 21L_1, the second lower gate insulator 21L_2, and the third lower gate insulator 21L_3.

The first, second and third lower gate insulators 21L_1, 21L_2, 21L_3 may have the same thickness and may include the same layers. Although FIG. 1 shows each of the first, second and third lower gate insulators 21L_1, 21L_2, 21L_3 as a single layer, in some embodiments, each of the first, second and third lower gate insulators 21L_1, 21L_2, 21L_3 may include an interfacial layer and a high-k material layer sequentially stacked on the corresponding lower active region 22L. For example, the interfacial layer may be a silicon oxide layer. The high-k material layer may include hafnium silicate, zirconium silicate, hafnium dioxide and/or zirconium dioxide.

In some embodiments, the first, second and third lower gate work function layers 23L may have the same thickness T4 and may include the same material(s), and the first, second and third lower gate metal layers 25L may include the same material(s). Each of the first, second and third lower gate work function layers 23L may be a single layer or may include multiple layers. For example, when the first, second and third lower transistors LT1, LT2, LT3 are n-type transistors, each of the first, second and third lower gate work function layers 23L may be an n-type work function layer (e.g., TiC layer, TiAl layer or TiAlC layer) or may include a p-type work function layer (e.g., TiN layer) and an n-type work function layer sequentially stacked on the lower active region 22L. When the first, second and third lower transistors LT1, LT2, LT3 are p-type transistors, each of the first to third lower gate work function layers 23L may be a p-type work function layer or may include a first p-type work function layer, an n-type work function layer, and a second p-type work function layer sequentially stacked on the lower active region 22L. The first to third lower gate metal layers 25L may include the same material(s). The first, second and third lower gate metal layers 25L may include, for example, tungsten (W), aluminum (Al) and/or copper (Cu). In some embodiments, the first, second and third lower gate metal layers 25L may be a tungsten layer. The first, second and third lower gate metal layers 25L may contact the first, second and third lower gate work function layers 23L, respectively, as illustrated in FIG. 1.

FIGS. 2A and 2B are tables for conductivity types and areal densities of dipole elements of the first lower gate insulator 21L_1 of the first lower transistor LT1, the second lower gate insulator 21L_2 of the second lower transistor LT2, and the third lower gate insulator 21L_3 of the third lower transistor LT3 for implementing the first to third lower transistors LT1, LT2, LT3 having different threshold voltages according to some embodiments of the present inventive concept. Specifically, the third row of the table in FIG. 2A describes relationships between threshold voltages of the first to third lower transistors LT1, LT2, LT3 when the first to third lower transistors LT1, LT2, LT3 are n-type transistors, and the fourth to sixth rows of the table in FIG. 2A indicate three different scenarios, respectively, for implementing the first to third lower transistors LT1, LT2, LT3 having the threshold voltages described in the third row in FIG. 2A. The third row of the table in FIG. 2B describes relationships between absolute values of threshold voltages of the first to third lower transistors LT1, LT2, LT3 when the first to third lower transistors LT1, LT2, LT3 are p-type transistors, and the fourth to sixth rows of the table in FIG. 2B indicate three different scenarios, respectively, for implementing the first to third lower transistors LT1, LT2, and LT3 having the threshold voltages described in the third row in FIG. 2B.

"N-dipole" in FIGS. 2A and 2B means that the lower gate insulator (i.e., the first lower gate insulator 21L_1, the second lower gate insulator 21L_2, or the third lower gate insulator 21L_3) includes n-type dipole elements (i.e., dipole elements having n-type conductivity) that decrease a threshold voltage of an n-type transistor and increase an absolute value of a threshold voltage of a p-type transistor by inducing dipoles in the lower gate insulator. "P-dipole" in FIGS. 2A and 2B means that the lower gate insulator includes p-type dipole elements (i.e., dipole elements having p-type conductivity) that decrease an absolute value of a threshold voltage of a p-type transistor and increase a threshold voltage of an n-type transistor by inducing dipoles in the lower gate insulator. For example, the lower gate insulator may include dipole elements at an areal density in a range of from about $10^{11}/cm^2$ to about $10^{18}/cm^2$. In some embodiments, the areal density of the dipole elements in the lower gate insulator may be in a range of from about $10^{11}/cm^2$ to about $10^{15}/cm^2$, and more specifically may be in a range of from about $10^{14}/cm^2$ to about $10^{15}/cm^2$.

"High areal density" in FIGS. 2A and 2B means that the lower gate insulator includes dipole elements at a high areal density to further increase or decrease an absolute value of a threshold voltage of a transistor. For example, n-type dipole elements may be lanthanum (La), yttrium (Y), strontium (Sr), lutetium (Lu), barium (Ba) or magnesium (Mg), and p-type dipole elements may be aluminum (Al), hafnium (Hf), titanium (Ti), zirconium (Zr), tantalum (Ta) or scandium (Sc). "–" in FIGS. 2A and 2B means that the lower gate insulator is devoid of dipole elements and does not include dipole elements that can induce dipoles therein. For example, the lower gate insulator may include dipole elements at a high areal density in a range of from about $10^{12}/cm^2$ to about $10^{18}/cm^2$.

Dipole elements of the first lower gate insulator 21L_1, the second lower gate insulator 21L_2, and the third lower gate insulator 21L_3 shift threshold voltages of the first lower transistor LT1, the second lower transistor LT2, and the third lower transistor LT3. Accordingly, the first lower transistor LT1, the second lower transistor LT2, and the third lower transistor LT3 can have different threshold voltages even when the lower gate work function layer 23L and the lower gate metal layer 25L of the first lower transistor LT1, the second lower transistor LT2, and the third lower transistor LT3 have the same dimensions and the same material(s).

Referring to FIGS. 2A and 2B, the first lower transistor LT1 including the first lower gate insulator 21L_1 has the lowest absolute value of the threshold voltage, and the third lower transistor LT3 including the third lower gate insulator 21L_3 has the highest absolute value of the threshold voltage, and the second lower transistor LT2 including the second lower gate insulator 21L_2 has a threshold voltage between the threshold voltages of the first lower transistor LT1 and the third lower transistor LT3.

For example, the first lower transistor LT1 may be a super low voltage transistor (SLVT) or a low voltage transistor (LVT), the second lower transistor LT2 may be a LVT or a regular transistor (RVT), and the third lower transistor LT3 may be an RVT or a high voltage transistor (HVT). For example, the SLVT may have an absolute value of a threshold voltage of 170 mV±50 mV, the LVT may have an absolute value of a threshold voltage of 250 mV±50 mV, the RVT may have an absolute value of a threshold voltage of 330 mV±50 mV, and the HVT may have an absolute value of a threshold voltage of 410 mV±50 mV.

Referring to FIG. 2A, each of the first to third lower transistors LT1, LT2, LT3 is a n-type type transistor, and the second lower transistor LT2 has a second threshold voltage Vth_2 that is lower than a third threshold voltage Vth_3 of the third lower transistor LT3, and the first lower transistor LT1 has a first threshold voltage Vth_1 that is lower than the second threshold voltage Vth_2. In some embodiments, the first to third lower transistors LT1, LT2, LT3 having those threshold voltages may be implemented by Scenario 1, Scenario 2, or Scenario 3.

According to Scenario 1, the second lower gate insulator 21L_2 is formed to be devoid of dipole elements, and thus the second threshold voltage Vth_2 of the second lower transistor LT2 is not shifted. The first lower gate insulator 21L_1 is formed to include n-type dipole elements such that the first threshold voltage Vth_1 of the first lower transistor LT1 shifts downward (i.e., decreases) relative to the second threshold voltage Vth_2. The third lower gate insulator 21L_3 is formed to include p-type dipole elements such that the third threshold voltage Vth_3 of the third lower transistor LT3 shifts upward (i.e., increases) relative to the second threshold voltage Vth_2.

According to Scenario 2, the third lower gate insulator 21L_3 is formed to be devoid of dipole elements, and thus the third threshold voltage Vth_3 of the third lower transistor LT3 is not shifted. The second lower gate insulator 21L_2 is formed to include n-type dipole elements such that the second threshold voltage Vth_2 of the second lower transistor LT2 shifts downward relative to the third threshold voltage Vth_3. The first lower gate insulator 21L_1 is formed to include n-type dipole elements at an areal density higher than that of the second lower gate insulator 21L_2 such that the first threshold voltage Vth_1 of the first lower transistor LT1 shifts downward relative to the second threshold voltage Vth_2.

According to Scenario 3, the first lower gate insulator 21L_1 is formed to be devoid of dipole elements, and thus the first threshold voltage Vth_1 of the first lower transistor LT1 is not shifted. The second lower gate insulator 21L_2 is formed to include p-type dipole elements such that the second threshold voltage Vth_2 of the second lower transistor LT2 shifts upward relative to the first threshold voltage Vth_1. The third lower gate insulator 21L_3 is formed to include p-type dipole elements at an areal density higher than that of the second lower gate insulator 21L_2 such that the third threshold voltage Vth_3 of the third lower transistor LT3 shifts upward relative to the second threshold voltage Vth_2.

Referring to FIG. 2B, each of the first to third lower transistors LT1, LT2, LT3 is a p-type type transistor, and thus threshold voltages of the first to third lower transistors LT1, LT2, LT3 have negative values. The second lower transistor LT2 has a second threshold voltage Vth_2, an absolute value of which is lower than an absolute value of a third threshold voltage Vth_3 of the third lower transistor LT3, and the first lower transistor LT1 has a first threshold voltage Vth_1, an absolute value of which is lower than the absolute value of the second threshold voltage Vth_2. In some embodiments, the first to third lower transistors LT1, LT2, LT3 having those threshold voltages may be implemented by Scenario 4, Scenario 5, or Scenario 6.

According to Scenario 4, the second lower gate insulator 21L_2 is formed to be devoid of dipole elements, and thus the second threshold voltage Vth_2 of the second lower transistor LT2 is not shifted. The first lower gate insulator 21L_1 is formed to include p-type dipole elements such that an absolute value of the first threshold voltage Vth_1 of the first lower transistor LT1 decreases relative to an absolute value of the second threshold voltage Vth_2. The third lower gate insulator 21L_3 is formed to include n-type dipole elements such that an absolute value of the third threshold voltage Vth_3 of the third lower transistor LT3 increases relative to the absolute value of the second threshold voltage Vth_2.

According to Scenario 5, the third lower gate insulator 21L_3 is formed to be devoid of dipole elements, and thus the third threshold voltage Vth_3 of the third lower transistor LT3 is not shifted. The second lower gate insulator 21L_2 is formed to include p-type dipole elements such that an absolute value of the second threshold voltage Vth_2 of the second lower transistor LT2 decreases relative to an absolute value of the third threshold voltage Vth_3. The first lower gate insulator 21L_1 is formed to include p-type dipole elements at an areal density higher than that of the second lower gate insulator 21L_2 such that an absolute value of the first threshold voltage Vth_1 of the first lower transistor LT1 decreases relative to the absolute value of the second threshold voltage Vth_2.

According to Scenario 6, the first lower gate insulator 21L_1 is formed to be devoid of dipole elements, and thus the first threshold voltage Vth_1 of the first lower transistor LT1 is not shifted. The second lower gate insulator 21L_2 is formed to include n-type dipole elements such that an absolute value of the second threshold voltage Vth_2 of the second lower transistor LT2 increases relative to an absolute value of the first threshold voltage Vth_1. The third lower gate insulator 21L_3 is formed to include n-type dipole elements at an areal density higher than that of the second lower gate insulator 21L_2 such that an absolute value of the third threshold voltage Vth_3 of the third lower transistor LT3 increases relative to the absolute value of the second threshold voltage Vth_2.

Still referring to FIG. 1, the first upper transistor UT1 may include a first upper active region 22U, a first upper gate insulator 21U, a first upper gate work function layer 23U_1, and a first upper gate metal layer 25U_1. The second upper transistor UT2 may include a second upper active region 22U, a second upper gate insulator 21U, a second upper gate work function layer 23U_2, and a second upper gate metal layer 25U_2. The third upper transistor UT3 may include a third upper active region 22U, a third upper gate insulator 21U, a third upper gate work function layer 23U_3, and a third upper gate metal layer 25U_3.

The first upper active region 22U, the second upper active region 22U, and the third upper active region 22U may be devoid of dipole elements (e.g., La, Y, Sr, Al, Hf, T1, Lu, Ba, Mg, Zr, Ta and Sc), and threshold voltages of the first upper transistor UT1, the second upper transistor UT2, and the third upper transistor UT3 may be modulated by the first upper gate work function layer 23U_1, the second upper gate work function layer 23U_2, and the third upper gate work function layer 23U_3 having different thicknesses.

The first upper gate work function layer 23U_1 may have a first thickness T1, the third upper gate work function layer 23U_3 may have a third thickness T3 that is thinner than the first thickness T1, and the second upper gate work function layer 23U_2 may have a second thickness T2 that is between the first thickness T1 and the third thickness T3. In some embodiments, the first upper transistor UT1 may include the third upper gate work function layer 23U_3 having the third thickness T3, and the third upper transistor UT3 may include the first upper gate work function layer 23U_1 having the first thickness T1.

Similar to the first to third lower gate work function layers 23L, the first to third upper gate work function layers 23U_1, 23U_2, 23U_3 may be a single layer or may include multiple layers and may include materials as discussed with reference to first to third lower gate work function layers 23L. The first to third upper gate metal layers 25U_1, 25U_2, 25U_3 may include the same material(s). The first to third upper gate metal layers 25U_1, 25U_2, 25U_3 may include, for example, W, Al or Cu. In some embodiments, the first to third upper gate metal layers 25U_1, 25U_2, and 25U_3 may be a tungsten layer. The first to third upper gate metal layers 25U_1, 25U_2, 25U_3 may contact the first to third upper gate work function layers 23U_1, 23U_2, 23U_3, respectively, as illustrated in FIG. 1

The first to third upper gate insulators 21U may have the same thickness and may include the same material(s). Although FIG. 1 shows each of the first to third upper gate insulators 21U as a single layer, in some embodiments, each of the first to third upper gate insulators 21U may include an interfacial layer and a high-k material layer sequentially stacked on the upper active region 22U. For example, the interfacial layer may be a silicon oxide layer, and the high-k material layer may include hafnium silicate, zirconium silicate, hafnium dioxide and/or zirconium dioxide.

In some embodiments, each of the lower active region 22L and the upper active region 22U may be a nanosheet. The nanosheets of the lower active region 22L and the upper active region 22U may include semiconductor material(s) (e.g., silicon, germanium, silicon-germanium, and/or a Group III-V semiconductor compound). For example, each of the nanosheets may have a thickness in a range of from 1 nm to 100 nm in the vertical direction. Although FIG. 1 shows that each of the lower active region 22L and the upper active region 22U have three active regions, the present invention is not limited thereto. In some embodiments, each of the lower active region 22L and the upper active region 22U may include one, two or more than three active regions. Further, although FIG. 1 shows that each of the lower active region 22L and the upper active region 22U has a rectangular sheet shape, each of the lower active region 22L and the upper active region 22U may be a nanowire that has a circular cross-section. In some embodiments, the lower active regions 22L may be nanosheets and the upper active regions 22U may be nano wires, or vice versa. Still further, each transistor of the first to third CFET stacks CFET1, CFET2, CFET3 may be a gate all around (GAA) transistor or a FinFET transistor.

The first, second and third upper gate work function layers 23U_1, 23U_2, 23U_3 may contact the first, second and third lower gate work function layers 23L, respectively, and may contact the first, second and third lower gate metal layers 25L, respectively.

Figure 3:
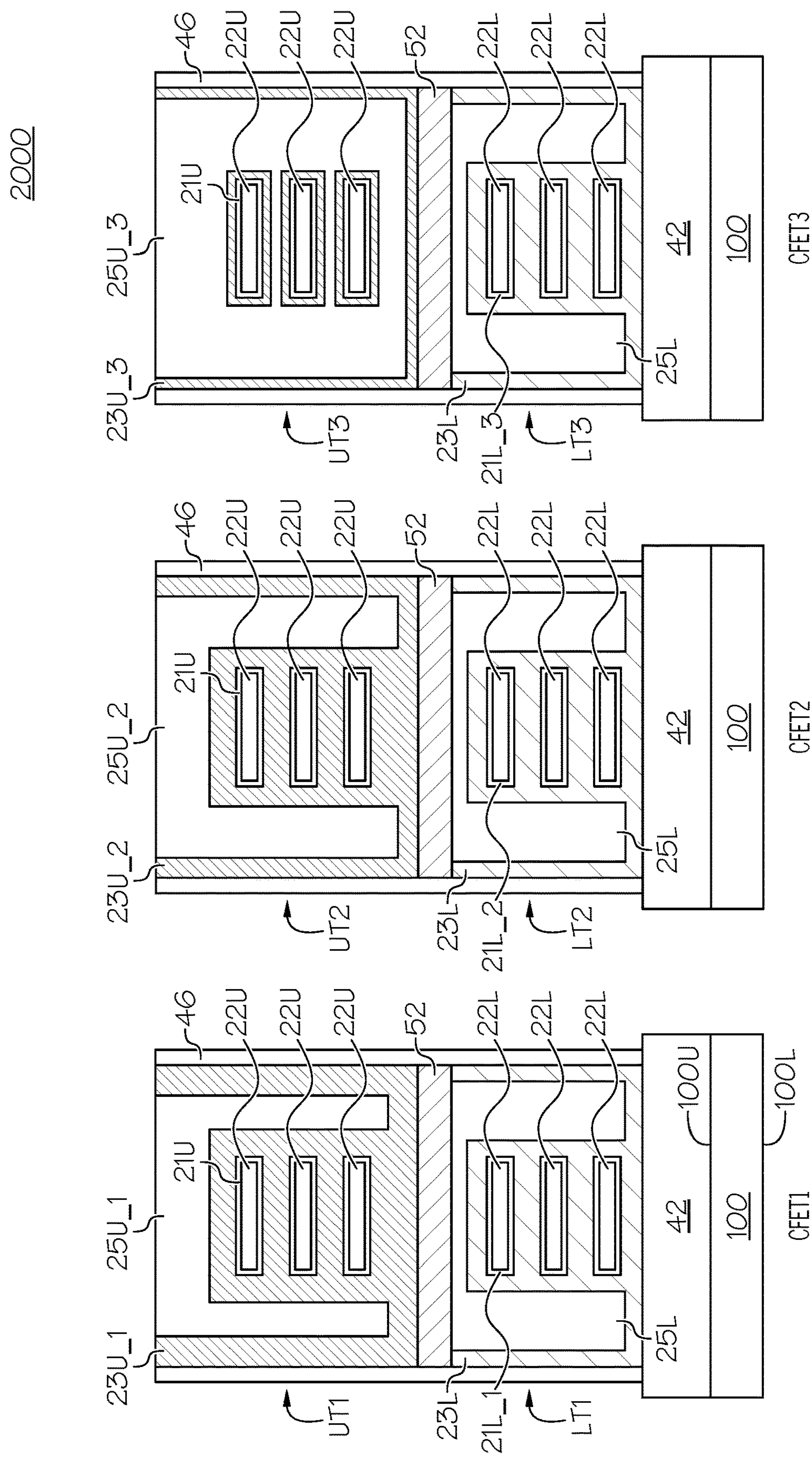
FIG. 3 shows cross-sectional views of CFET stacks of an integrated circuit device according to some embodiments of the present invention.

FIG. 3 shows cross-sectional views of CFET stacks of an integrated circuit device 2000 according to some embodiments of the present invention. The integrated circuit device 2000 illustrated in FIG. 3 may be similar to the integrated circuit device 1000 illustrated in FIG. 1 with the primary difference being that an etch barrier layer 52 is provided between the lower transistor (i.e., LT1, LT2 or LT3) and the upper transistor (i.e., UT1, UT2 or UT3). The etch barrier layer 52 may be selectively formed on upper surfaces of the lower transistors and may not be formed on the second insulating layer 46. The etch barrier layer 52 may protect the lower transistors from etchants that are used while the upper transistors are formed. The etch barrier layer 52 may be an electrical conductor. For example, the etch barrier layer 52 may include ruthenium (Ru), platinum (Pt) and/or palladium (Pd) and may have a thickness in a range of about 1 nm to about 10 nm. In some embodiments, the thickness of the etch barrier layer 52 may be in a range of about 1 nm to about 5 nm.

Figure 4:
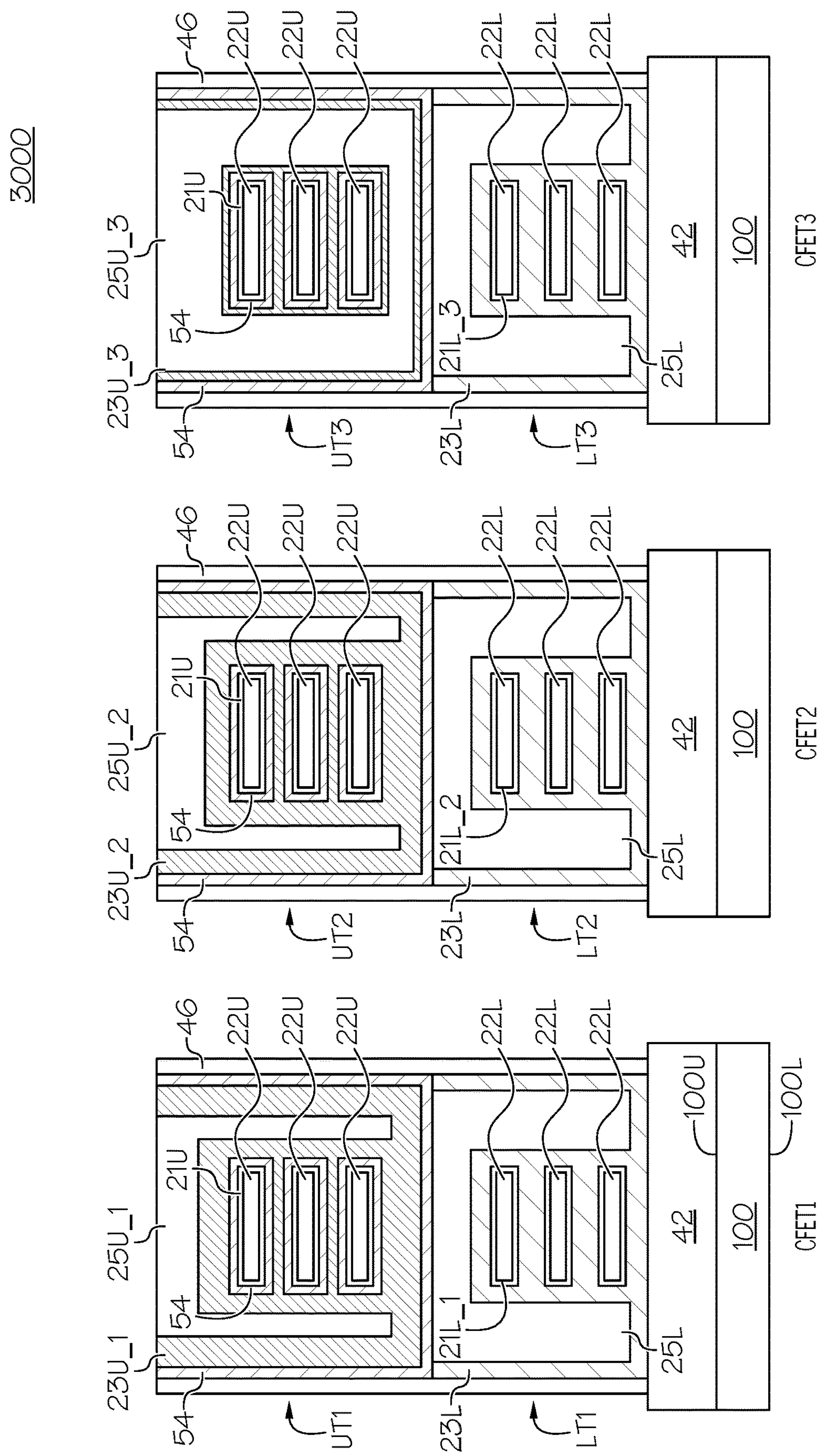
FIG. 4 shows cross-sectional views of CFET stacks of an integrated circuit device according to some embodiments of the present invention.

FIG. 4 shows cross-sectional views of CFET stacks of an integrated circuit device 3000 according to some embodiments of the present invention. The integrated circuit device 3000 illustrated in FIG. 4 may be similar to the integrated circuit device 1000 illustrated in FIG. 1 with the primary difference being that the integrated circuit device 3000 includes an etch barrier layer 54. The etch barrier layer 54 may include a first portion extending between the lower transistor (i.e., LT1, LT2 or LT3) and the upper transistor (i.e., UT1, UT2 or UT3) and a second portion extending between the upper gate insulator 21U and the upper gate work function layer (i.e., 23U_1, 23U_2 or 23U_3). In some embodiments, the second portion of the etch barrier layer 54 may enclose the upper active region 22U. The etch barrier layer 54 may be an electrical conductor. For example, the etch barrier layer 54 may include tantalum nitride (TaN) and may have a thickness 0.1 nm to about 10 nm. In some embodiments, the thickness of the etch barrier layer 54 may be in a range of about 0.5 nm to about 5 nm.

Figure 10:
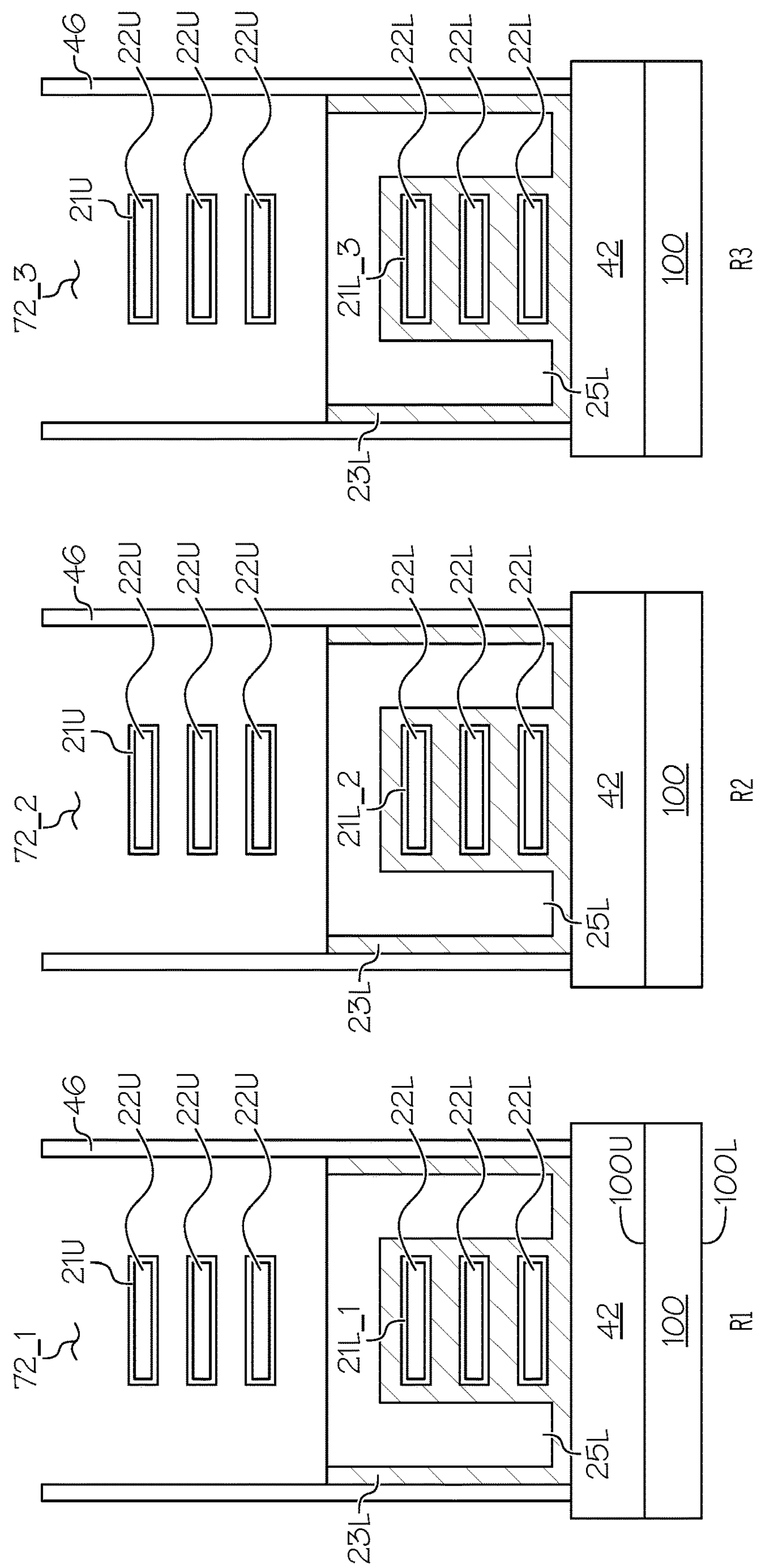
Figure 11:
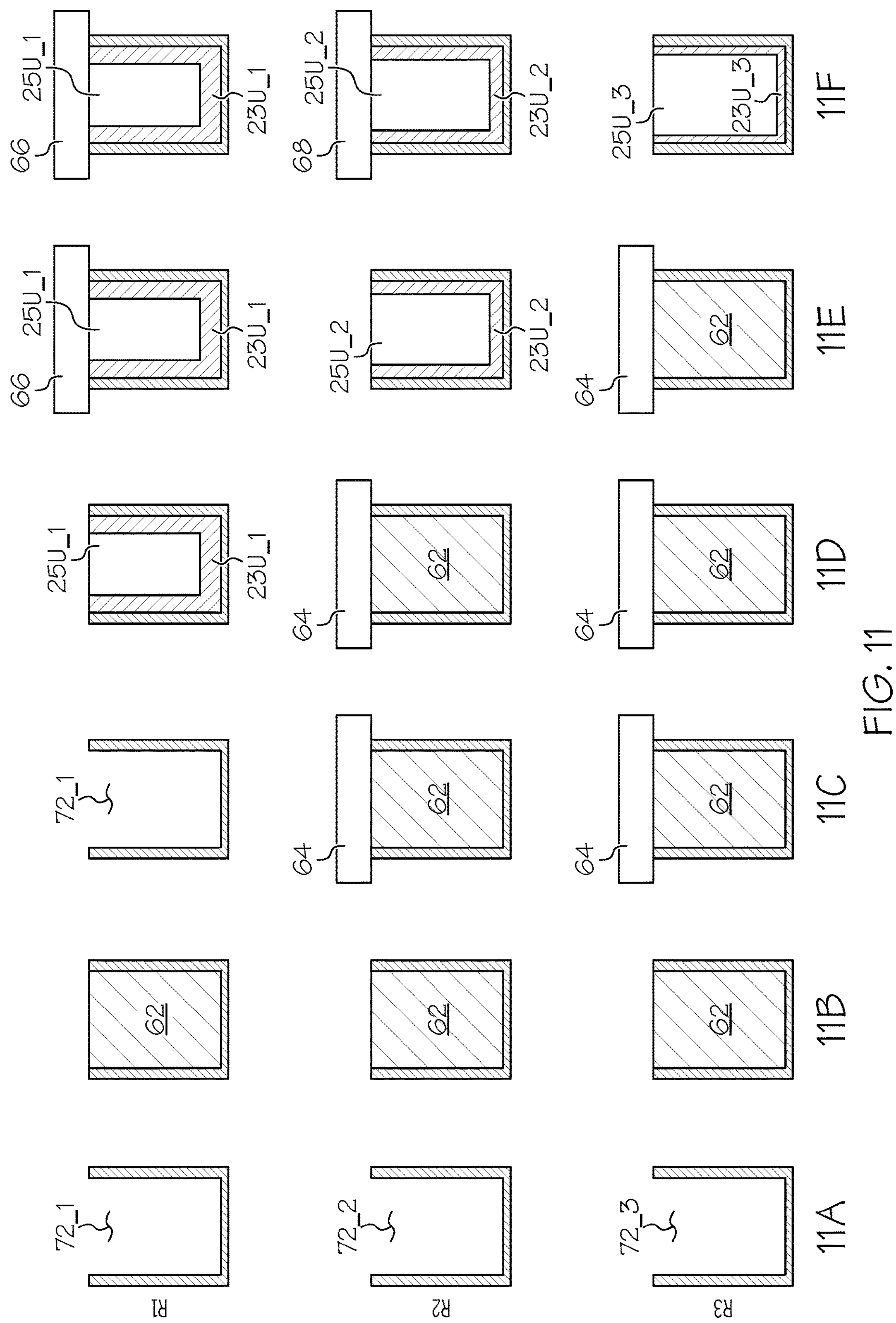
Figure 12:
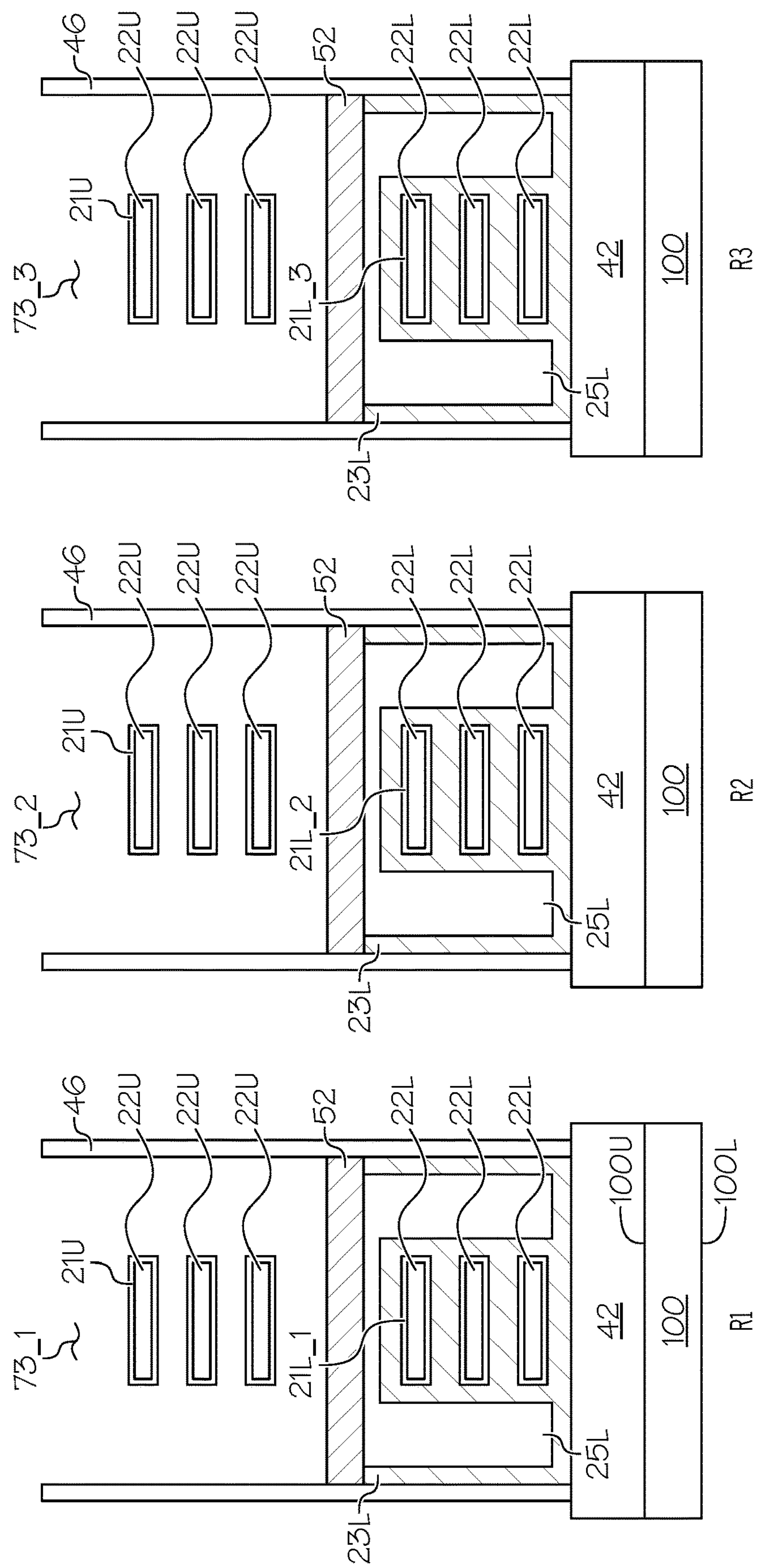
FIGS. 12-14 are cross-sectional views illustrating methods of forming an integrated circuit device according to some embodiments of the present invention.
Figure 13:
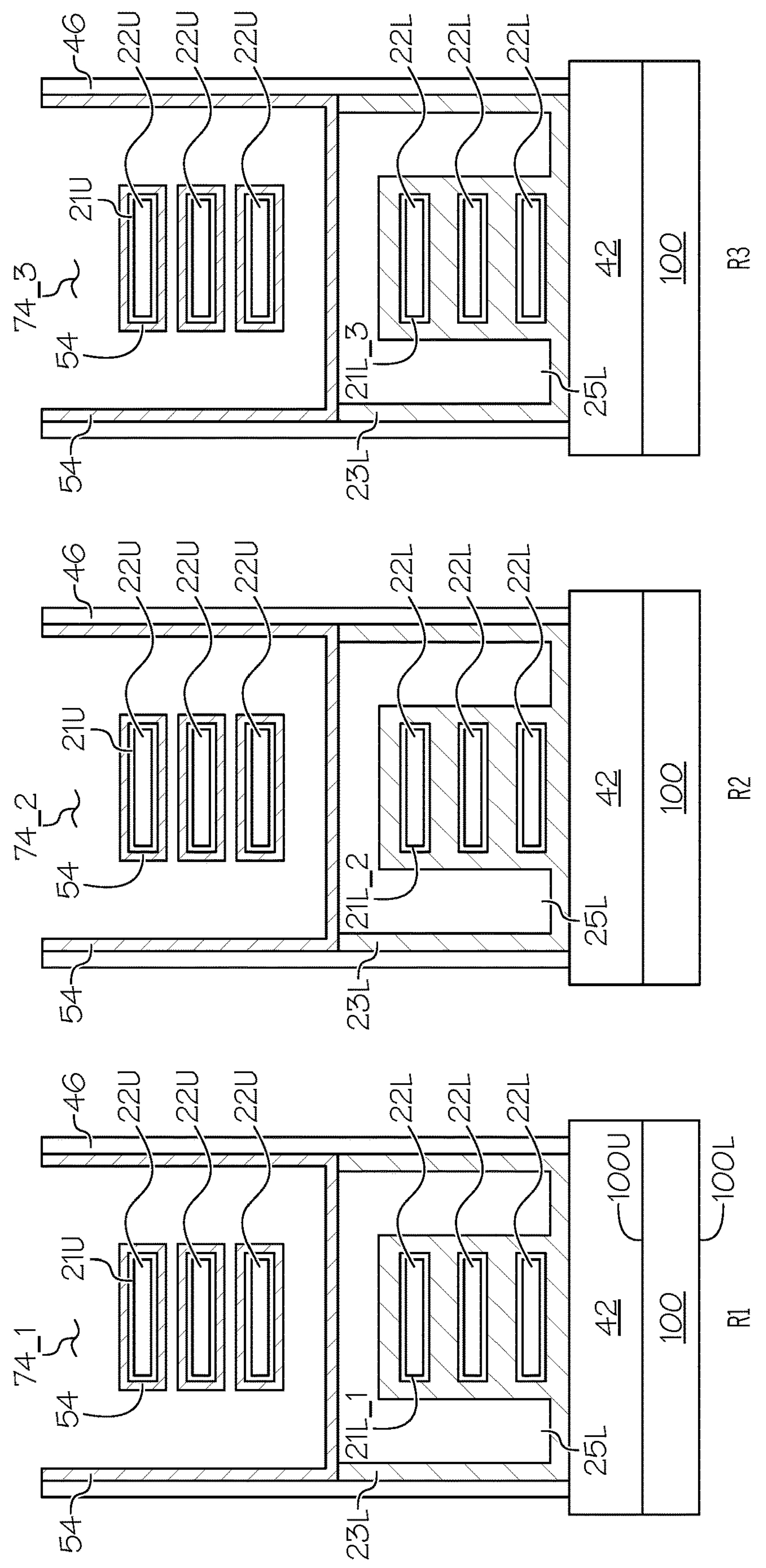
Figure 14:
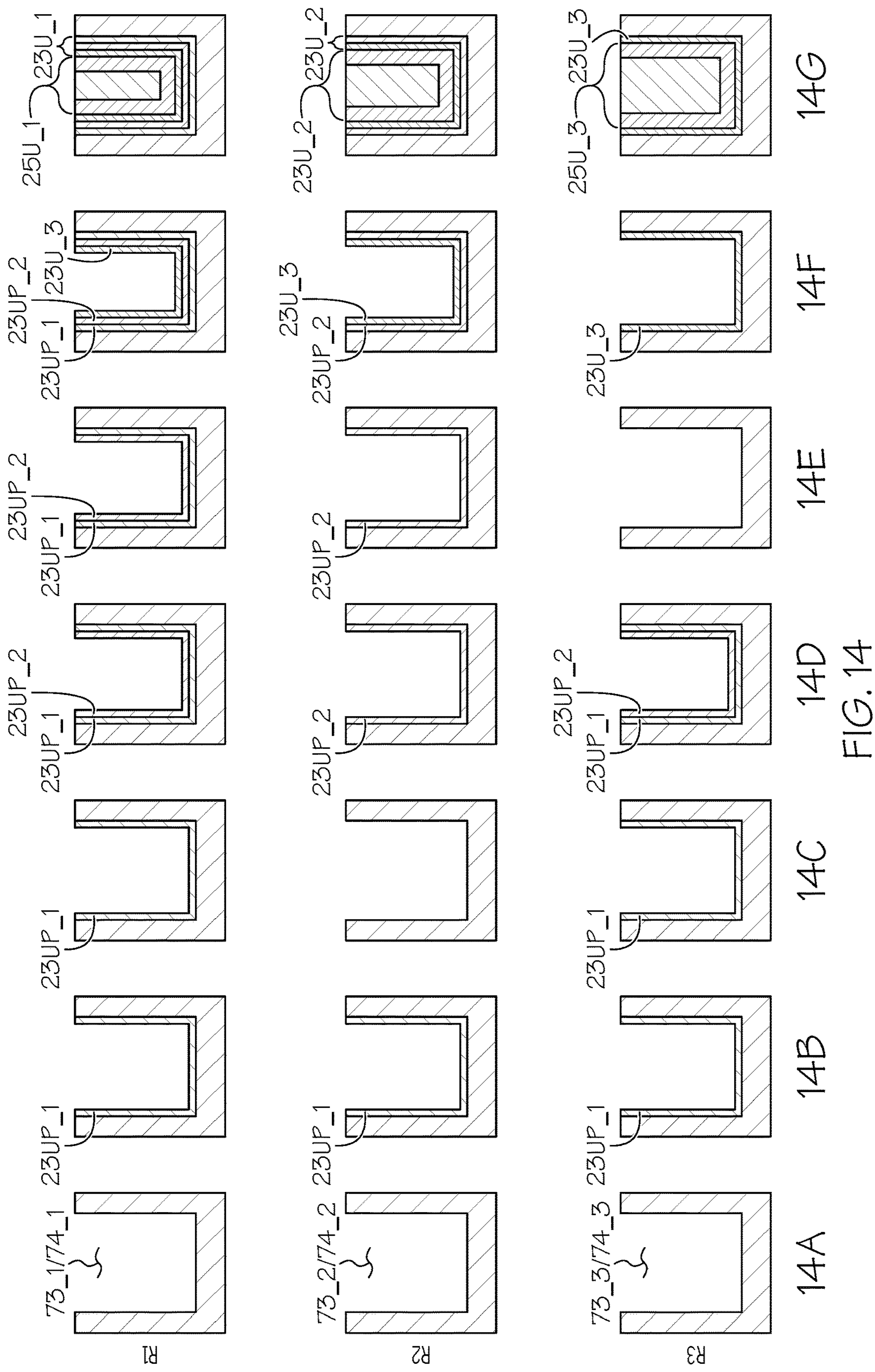
Figure 15:
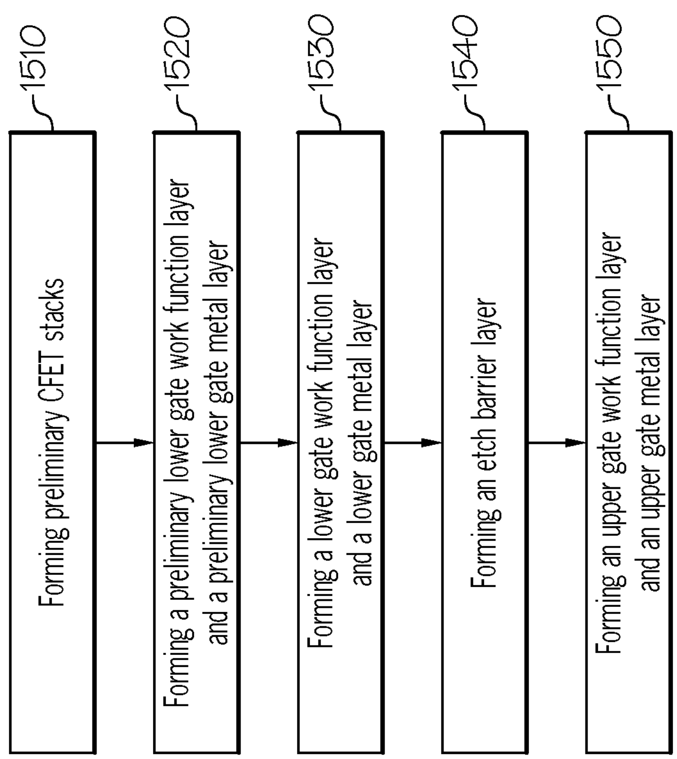
FIG. 15 is a flow chart of methods of forming an integrated circuit device according to some embodiments of the present invention.

FIGS. 5-11 are cross-sectional views illustrating methods of forming the integrated circuit device 1000 illustrated in FIG. 1 according to some embodiments of the present invention, and FIGS. 12-14 are cross-sectional views illustrating methods of forming the integrated circuit devices 2000 and 3000 illustrated in FIGS. 3 and 4 according to some embodiments of the present invention. FIG. 15 is a flow chart of methods of forming the integrated circuit devices 1000, 2000, and 3000 according to some embodiments of the present invention. In FIGS. 5-14, R1, R2, R3 refer to a first region R1 in which the first CFET stack CFET1 is formed, a second region R2 in which the second CFET stack CFET2 is formed, and a third region R3 in which the third CFET stack CFET3 is formed.

Referring to FIGS. 5-8 and 15, the methods may include forming preliminary CFET stacks (Block 1510) on a substrate 100. FIGS. 5-7 describes the methods of forming the preliminary CFET stacks when the first lower gate insulator 21L_1, the second lower gate insulator 21L_2, and the third lower gate insulator 21L_3 are formed as indicated as Scenario 2 in FIG. 2A. The first lower gate insulator 21L_1, the second lower gate insulator 21L_2, and the third lower gate insulator 21L_3 formed as indicated in the remaining Scenarios in FIGS. 2A and 2B may be formed by similar processes.

Referring to FIG. 5, a first lower active region 22L, a first preliminary lower gate insulator 21LP_1, a first upper active region 22U, and a first upper gate insulator 21U may be formed in the first region R1. A second lower active region 22L, a second preliminary lower gate insulator 21LP_2, a second upper active region 22U, and a second upper gate insulator 21U may be formed in the second region R2. A third lower active region 22L, a third lower gate insulator 21L_3, a third upper active region 22U, and a third upper gate insulator 21U may be formed in the third region R3. The first to third lower active regions 22L, the first to third upper active regions 22U, the first to third first upper gate insulators 21U, the first and second preliminary lower gate insulators 21LP_1, 21LP_2, and the third lower gate insulator 21L_3 may be formed by various methods known in the field to which the present invention pertains.

Further, a first dipole layer 20_1 including n-type dipole elements may be formed on the first preliminary lower gate insulator 21LP_1. The first dipole layer 20_1 may enclose the first lower active region 22L. The first dipole layer 20_1 may be a lanthanum oxide layer, an yttrium oxide layer, a strontium oxide layer, a lutetium oxide layer, a barium oxide layer, or a magnesium oxide layer and may have a first thickness in a range of about 0.1 nm to 2 nm. The first dipole layer 20_1 may not be in the second region R2 and the third region R3. The first dipole layer 20_1 may be formed in the first to third regions R1, R2, R3 and then may be removed from the second and third regions R2, R3 or the first dipole layer 20_1 may be selectively formed in the first region R1. In some embodiments, the first dipole layer 20_1 may be a lanthanum oxide layer.

Referring to FIG. 6, after the first dipole layer 20_1 is formed, a first annealing process may be performed to drive n-type dipole elements (e.g., La, Y, Sr, Lu, Ba or Mg) of the first dipole layer 20_1 into the first preliminary lower gate insulator 21LP_1 such that the first preliminary lower gate insulator 21LP_1 is converted into the first lower gate insulator 21L_1. The first annealing process may be performed at a first temperature in a range of about 600° C. to about 1000° C. After the first lower gate insulator 21L_1 is formed, the first dipole layer 20_1 may be removed.

Referring to FIG. 7, a second dipole layer 20_2 including n-type dipole elements may be formed on the second preliminary lower gate insulator 21LP_2. The second dipole layer 20_2 may enclose the second lower active region 22L. The second dipole layer 20_2 may be a lanthanum oxide layer, an yttrium oxide layer or a strontium oxide layer and may have a second thickness in a range of about 0.1 nm to 2 nm. The second thickness may be thinner than the first thickness to form the second lower gate insulator 21L_2 including n-type dipole elements at a lower areal density than that of the first lower gate insulator 21L_1. For example, the second thickness may be between 0.1 nm to 1 nm. The second dipole layer 20_2 may not be in the first region R1 and the third region R3. The second dipole layer 20_2 may be formed in the first to third regions R1, R2, R3 and then may be removed from the first region R1 and the third region R3, or the second dipole layer 20_2 may be selectively formed in the second region R2. In some embodiments, the second dipole layer 20_2 may be a lanthanum oxide layer.

When the first, second and third lower transistors LT1, LT2, and LT3 are p-type transistors, the first and second dipole layers 20_1 and 20_2 may be an oxide layer including p-type dipole elements (e.g., Al, Hf, T1, Zr, Ta or Sc). For example, the first and second dipole layers 20_1 and 20_2 may be an aluminum oxide layer, a hafnium oxide layer, a titanium oxide layer, a zirconium oxide layer, a tantalum oxide layer or a scandium oxide layer. In some embodiments, at least one of the first and second dipole layers 20_1 and 20_2 may be an aluminum oxide layer.

Figure 8:
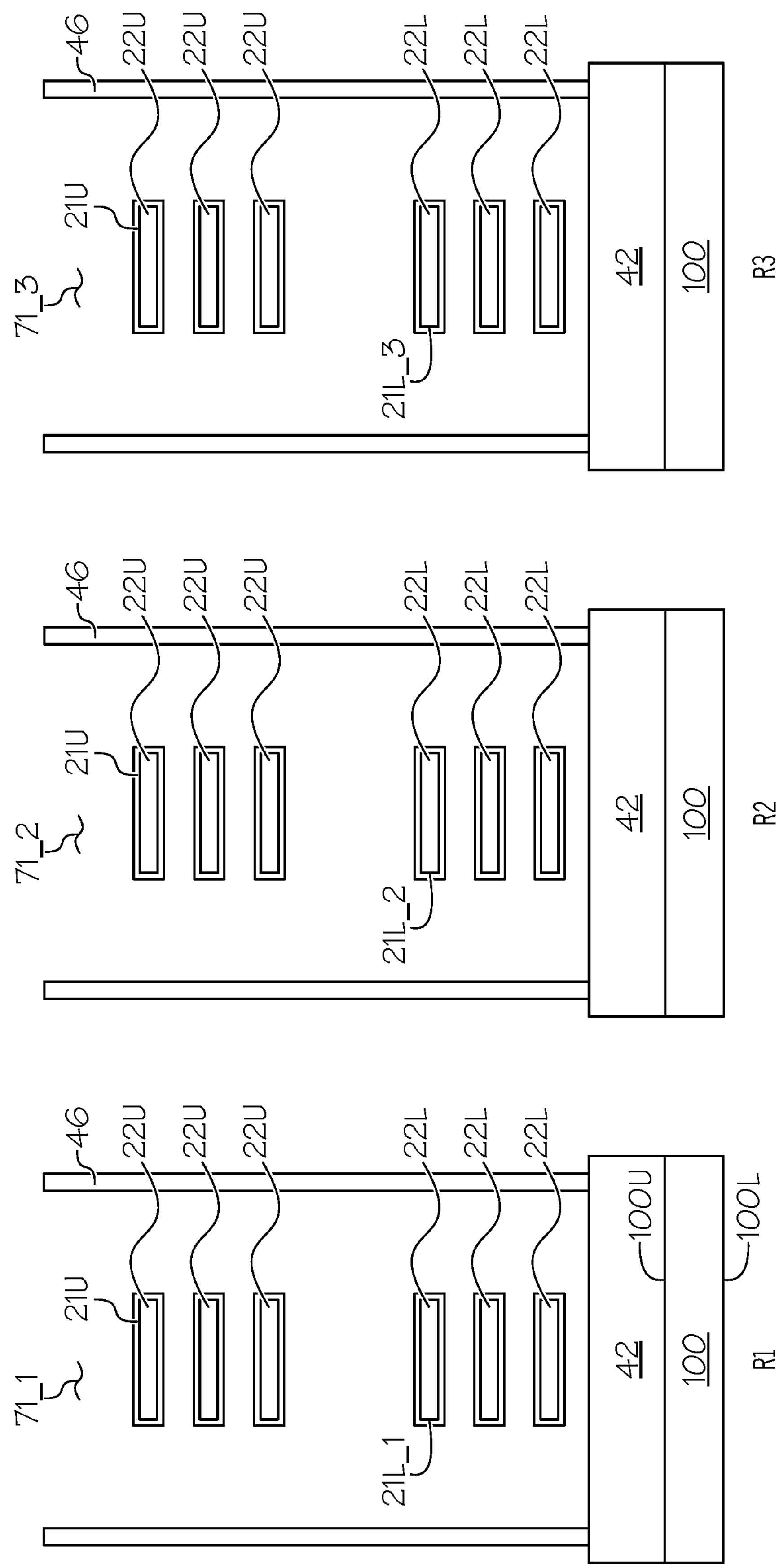

Referring to FIG. 8, after the second dipole layer 20_2 is formed, a second annealing process may be performed to drive n-type dipole elements (e.g., La, Y, Sr, Lu, Ba or Mg) of the second dipole layer 20_2 into the second preliminary lower gate insulator 21LP_2 such that the second preliminary lower gate insulator 21LP_2 is converted into the second lower gate insulator 21L_2. The second annealing process may be performed at a second temperature in a range of about 600° C. to about 1000° C. When the second thickness of the dipole layer 20_2 is similar to the first thickness of the first dipole layer 20_1, the second annealing process may be performed at the second temperature that is lower than the first temperature to drive less dipole elements into the second preliminary lower gate insulator 21LP_2. For example, when the first thickness of the first dipole layer 20_1 and the second thickness of the dipole layer 20_2 are similar, the first temperature may be about 800° C., and the second temperature may be about 700° C. After the second lower gate insulator 21L_2 is formed, the second dipole layer 20_2 may be removed thereby first to third preliminary CFET stacks are formed on the substrate 100.

The first preliminary CFET stack formed in the first region R1 may include the first lower active region 22L, the first lower gate insulator 21L_1, the first upper active region 22U, and the first upper gate insulator 21U, and the first preliminary CFET stack may be formed in a first opening 71_1 of the second insulating layer 46. A second preliminary CFET stack formed in the second region R2 may include the second lower active region 22L, a second lower gate insulator 21L_2, the second upper active region 22U, and the second upper gate insulator 21U, and the second preliminary CFET stack may be formed in a second opening 71_2 of the second insulating layer 46. A third preliminary CFET stack formed in the third region R3 may include the third lower active region 22L, the third lower gate insulator 21L_3, the third upper active region 22U, and the third upper gate insulator 21U, and the third preliminary CFET stack may be formed in a third opening 71_3 of the second insulating layer 46. The first to third lower gate insulators 21L_1, 21L_2, 21L_3 may include dipole elements having different conductivity types or may include dipole elements at different dipole areal densities as described in the tables of FIGS. 2A and 2B.

Figure 9:
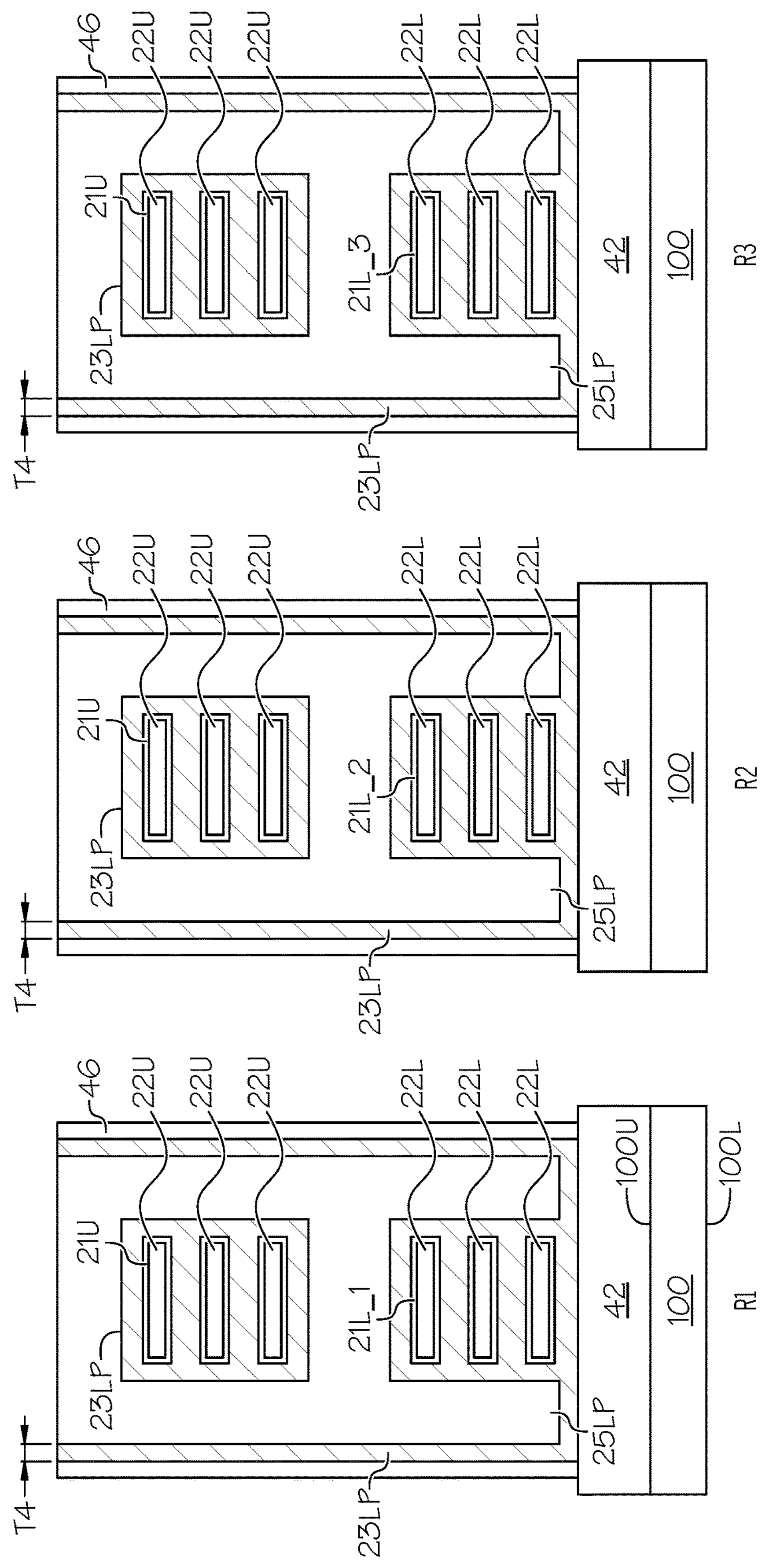

Referring to FIGS. 9 and 15, the methods may include sequentially forming a preliminary lower gate work function layer 23LP and a preliminary lower gate metal layer 25LP in the first opening 71_1, the second opening 71_2, and the third opening 71_3 (Block 1520). The preliminary lower gate work function layer 23LP may have a uniform thickness T4 along a surface of the second insulating layer 46 and along surfaces of the first to third lower active regions 22L. The preliminary lower gate metal layer 25LP may fill the first opening 71_1, the second opening 71_2, and the third opening 71_3.

Referring to FIGS. 10 and 15, the methods may include forming lower gate work function layers 23L and lower gate metal layers 25L by removing the preliminary lower gate work function layer 23LP and the preliminary lower gate metal layer 25LP from upper portions of the first opening 71_1, the second opening 71_2, and the third opening 71_3 (Block 1530). The same layers (i.e., the preliminary lower gate work function layer 23LP and the preliminary lower gate metal layer 25LP) are removed from the first opening 71_1, the second opening 71_2, and the third opening 71_3, and thus the lower gate work function layers 23L and the lower gate metal layers 25L having uniform thicknesses may be formed in the first opening 71_1, the second opening 71_2, and the third opening 71_3 by the same process(es). The preliminary lower gate work function layer 23LP and the preliminary lower gate metal layer 25LP may be removed by various processes (e.g., a dry etch process and/or a wet etch process). After the preliminary lower gate work function layer 23LP and the preliminary lower gate metal layer 25LP are removed, the first to third upper gate insulators 21U may be exposed, and a first upper opening 72_1, a second upper opening 72_2, and a third upper opening 72_3 may be defined on the lower transistors (e.g., LT1, LT2, and LT3 in FIG. 1), respectively, in the second insulating layer 46.

Referring to FIGS. 11 and 15, the methods may include forming first to third upper gate work function layers 23U_1, 23U_2, 23U_3 and forming first to third upper gate metal layers 25U_1, 25U_2, 25U_3 (Block 1550). For simplicity of illustration, FIG. 11 does not show the lower transistors, the first to third upper active regions 22U and the first to third upper gate insulators 21U. Column 11A through Column 11F in FIG. 11 illustrate intermediate structures sequentially formed.

Referring to FIG. 11, a dummy material 62 may be formed in the first upper opening 72_1, the second upper opening 72_2, and the third upper opening 72_3 (Column 11B). The dummy material 62 may be formed by, for example, a spin coating process and may have an etch selectivity with respect to the first to third upper gate insulators 21U.

A first mask layer 64 may be formed on the dummy material 62 formed in the second region R2 and the third region R3, and then the dummy material 62 formed in the first upper opening 72_1 may be removed (Column 11C). A first upper gate work function layer 23U_1 and a first upper gate metal layer 25U_1 may be sequentially formed in the first upper opening 72_1 (Column 11D). For example, the first upper gate work function layer 23U_1 may have a thickness in a range of from about 15 Å to about 45 Å.

A second mask layer 66 may be formed on the first upper gate work function layer 23U_1 and the first upper gate metal layer 25U_1 in the first region R1 and then the first mask layer 64 and the dummy material 62 formed in the second region R2 may be removed. Then, a second upper gate work function layer 23U_2 and a second upper gate metal layer 25U_2 may be sequentially formed in the second upper opening 72_2 (Column 11E). For example, the second upper gate work function layer 23U_2 may have a thickness in a range of from about 10 Å to about 25 Å.

A third mask layer 68 may be formed on the second upper gate work function layer 23U_2 and the second upper gate metal layer 25U_2 in the second region R2 and then the first mask layer 64 and the dummy material 62 formed in the third region R3 may be removed. After then, a third upper gate work function layer 23U_3 and a third upper gate metal layer 25U_3 may be sequentially formed in the third upper opening 72_3 (Column 11F). For example, the third upper gate work function layer 23U_3 may have a thickness in a range of from about 5 Å to about 10 Å.

Referring to FIGS. 12, 13 and 15, in some embodiments, an etch barrier layer 52 or 54 may be formed on the lower gate work function layers 23L and the lower gate metal layers 25L (Block 1540). The etch barrier layer 52 or 54 may cover the lower gate work function layers 23L and the lower gate metal layers 25L to inhibit etching of the lower gate work function layers 23L and the lower gate metal layers 25L while first to third upper gate work function layers 23U_1, 23U_2, 23U_3 and first to third upper gate metal layers 25U_1, 25U_2, 25U_3 are formed.

Referring to FIG. 12, the etch barrier layer 52 may be formed on the structure in FIG. 10 by performing an area selective atomic layer deposition process that selectively grows the etch barrier layer 52 on conductive materials (i.e., the lower gate work function layers 23L and the lower gate metal layers 25L). The etch barrier layer 52 may not grow on an insulating material, and the etch barrier layer 52 may expose upper portions of the second insulating layer 46, which define first, second and third upper openings 73_1, 73_2, 73_3, respectively.

For example, the etch barrier layer 52 may include Ru, Pt and/or Pd and may have an etch selectivity with respect to the first to third upper gate work function layers 23U_1, 23U_2, 23U_3. For example, the etch barrier layer 52 may have a thickness in a range of about 1 nm to about 10 nm. In some embodiments, the thickness of the etch barrier layer 52 may be in a range of about 1 nm to about 5 nm.

Referring to FIG. 13, the etch barrier layer 54 may be conformally formed on the structure in FIG. 10 by performing a deposition process (e.g., an atomic layer deposition or a chemical vapor deposition process). The etch barrier layer 54 may have a uniform thickness as illustrated in FIG. 13. The etch barrier layer 54 may include a first portion formed on upper surfaces of the lower gate work function layers 23L and the lower gate metal layers 25L and on surfaces of the second insulating layer 46 defining the first to third upper openings 72_1, 72_2, 72_3 in FIG. 10. The etch barrier layer 54 may also include a second portion formed on the upper gate insulator 21U. As illustrated in FIG. 13, the etch barrier layer 54 may define first, second, and third upper openings 74_1, 74_2, 74_3 on the lower gate work function layers 23L and the lower gate metal layers 25L.

Referring to FIGS. 14 and 15, the methods may include forming first to third upper gate work function layers 23U_1, 23U_2, 23U_3 and forming first to third upper gate metal layers 25U_1, 25U_2, 25U_3 (Block 1550) on the etch barrier layer 52 or 54. For simplicity of illustration, FIG. 14 does not show the lower transistors, the first to third upper active regions 22U and the first to third upper gate insulators 21U. Column 14A through Column 14G in FIG. 14 illustrate intermediate structures sequentially formed.

A first preliminary upper gate work function layer 23UP_1 may be formed in the first to third upper openings 73_1/74_1, 73_2/74_2, 73_3/74_3 (Column 14B). The first preliminary upper gate work function layer 23UP_1 may have a uniform thickness as illustrated. For example, the first preliminary upper gate work function layer 23UP_1 may have a thickness in a range of from about 5 Å to about 20 Å. After the first preliminary upper gate work function layer 23UP_1 is formed, the first preliminary upper gate work function layer 23UP_1 formed in the second region R2 may be removed (Column 14C). A mask layer covering the first and third regions R1, R3 may be formed before removing the first preliminary upper gate work function layer 23UP_1 formed in the second region R2.

A second preliminary upper gate work function layer 23UP_2 may be formed in the first to third regions R1, R2, R3 (Column 14D), and the first and second preliminary upper gate work function layers 23UP_1, 23UP_2 formed in the third region R3 may be removed (Column 14E). The second preliminary upper gate work function layer 23UP_2 may have a uniform thickness as illustrated. For example, the second preliminary upper gate work function layer 23UP_2 may have a thickness in a range of from about 5 Å to about 20 Å. A mask layer covering the first and second regions R1, R2 may be formed before removing the first and second preliminary upper gate work function layers 23UP_1, 23UP_2 formed in the third region R3.

A third upper gate work function layer 23U_3 may be formed in the first to third regions R1, R2, R3 (Column 14F) and then first to third upper gate metal layers 25U_1, 25U_2, 25U_3 may be formed in the first to third regions R1, R2, R3, respectively (Column 14G). The third upper gate work function layer 23U_3 may have a uniform thickness as illustrated. For example, the third upper gate work function layer 23U_3 may have a thickness in a range of from about 5 Å to about 10 Å.

In some embodiments, each of the first and second preliminary upper gate work function layers 23UP_1, 23UP_2 and the third upper gate work function layer 23U_3 may be a TiN layer, and thus an interface between those layers may not be visible. In some embodiments, the first and second preliminary upper gate work function layers 23UP_1, 23UP_2 and the third upper gate work function layer 23U_3 may include different materials.

In some embodiments, the first to third upper gate work function layers 23U_1, 23UP_2, 23U_3 and the first to third upper gate metal layers 25U_1, 25U_2, 25U_3 may be formed in the first to third upper openings 73_1/74_1, 73_2/74_2, 73_3/74_3 in FIGS. 12 and 13 using the processes described with reference to FIG. 11.

Example embodiments are described herein with reference to the accompanying drawings. Many different forms and embodiments are possible without deviating from the scope of the present inventive concept. Accordingly, the present inventive concept should not be construed as limited to the example embodiments set forth herein. Rather, these example embodiments are provided so that this disclosure will be thorough and complete and will convey the scope of the present inventive concept to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present inventive concept.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents and shall not be restricted or limited by the foregoing detailed description.

What is claimed is:

1. An integrated circuit device comprising:

a first complementary field effect transistor (CFET) stack on a substrate, the first CFET stack comprising:

a first upper transistor comprising:

a first upper active region; and a first upper gate work function layer having a first thickness on the first upper active region; and a first lower transistor comprising:

a first lower active region;

a first lower gate insulator comprising first dipole elements at a first areal density; and a first lower gate work function layer on the first lower gate insulator; and a second CFET stack on the substrate, the second CFET stack comprising:

a second upper transistor comprising:

a second upper active region; and a second upper gate work function layer having a second thickness on the second upper active region; and a second lower transistor comprising:

a second lower active region;

a second lower gate insulator comprising second dipole elements at a second areal density; and a second lower gate work function layer on the second lower gate insulator, wherein the first dipole elements and the second dipole elements have different conductivity types, or the first areal density is different from the second areal density when the first dipole elements and the second dipole elements have the same conductivity type, and the first thickness is different from the second thickness.

2. The integrated circuit device of claim 1, wherein the first lower gate work function layer and the second lower gate work function layer have an equal thickness and comprise the same material.

3. The integrated circuit device of claim 2, wherein the first lower transistor further comprises a first lower gate metal layer on the first lower gate work function layer, and the second lower transistor further comprises a second lower gate metal layer on the second lower gate work function layer, and the first lower gate metal layer and the second lower gate metal layer comprise the same material.

4. The integrated circuit device of claim 2, wherein the first lower transistor and the second lower transistor have different threshold voltages.

5. The integrated circuit device of claim 1, wherein the first dipole elements and the second dipole elements have different conductivity types, and the first dipole elements are lanthanum (La), yttrium (Y), strontium (Sr), lutetium (Lu), barium (Ba) or magnesium (Mg), and the second dipole elements are aluminum (Al), hafnium (Hf), Titanium (Ti) zirconium (Zr), tantalum (Ta) or scandium (Sc).

6. The integrated circuit device of claim 1, wherein the first dipole elements and the second dipole elements have the same conductivity type, and the first dipole elements and the second dipole elements are each independently lanthanum (La), yttrium (Y), strontium (Sr), lutetium (Lu), barium (Ba) or magnesium (Mg) or are each independently aluminum (Al), hafnium (Hf), titanium (Ti) zirconium (Zr), tantalum (Ta) or scandium (Sc).

7. The integrated circuit device of claim 1, further comprising:

a first etch barrier layer extending between the first upper gate work function layer and the first lower gate work function layer; and a second etch barrier layer extending between the second upper gate work function layer and the second lower gate work function layer, wherein the first etch barrier layer and the second etch barrier layer have an equal thickness and comprise the same material.

8. The integrated circuit device of claim 7, wherein the first etch barrier layer and the second etch barrier layer comprise ruthenium (Ru), platinum (Pt), palladium (Pd) or tantalum nitride (TaN).

9. The integrated circuit device of claim 7, wherein the first etch barrier layer comprises a first portion extending between the first upper gate work function layer and the first lower gate work function layer and a second portion extending between the first upper active region and the first upper gate work function layer, and the second etch barrier layer comprises a first portion extending between the second upper gate work function layer and the second lower gate work function layer and a second portion extending between the second upper active region and the second upper gate work function layer.

10. The integrated circuit device of claim 1, further comprising a third CFET stack on the substrate, wherein the third CFET comprises:

a third upper transistor comprising:

a third upper active region; and a third upper gate work function layer having a third thickness on the third upper active region, wherein the third thickness is different from the first and second thicknesses; and a third lower transistor comprising:

a third lower active region; and a third lower gate insulator that is devoid of dipole elements; and a third lower gate work function layer on the third lower gate insulator.

11. The integrated circuit device of claim 10, wherein the first, second and third lower gate work function layers have an equal thickness and comprise the same material.

* * * * *